(12) United States Patent
Chen et al.

(10) Patent No.: US 8,810,291 B2
(45) Date of Patent: Aug. 19, 2014

(54) PHASE-LOCKED LOOP

(71) Applicant: National Chiao Tung University, Hsinchu (TW)

(72) Inventors: Wei-Zen Chen, Hsinchu (TW); Yan-Ting Wang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/900,556

(22) Filed: May 23, 2013

(65) Prior Publication Data

US 2014/0118037 A1 May 1, 2014

(30) Foreign Application Priority Data

Oct. 25, 2012 (TW) .............................. 101139487 A

(51) Int. Cl.
*H03L 7/06* (2006.01)
*H03L 7/08* (2006.01)

(52) U.S. Cl.
CPC ....................................... *H03L 7/08* (2013.01)
USPC ........... 327/156; 327/158; 327/161; 375/373; 375/375; 375/376

(58) Field of Classification Search
USPC ........... 327/156, 158, 161; 375/373, 375, 376
See application file for complete search history.

(56) References Cited

U.S. PATENT DOCUMENTS

| 7,671,640 | B2 | 3/2010 | Lee et al. |
| 7,830,212 | B2 | 11/2010 | Lee et al. |
| 7,961,058 | B2 | 6/2011 | Luong et al. |
| 2010/0073052 | A1* | 3/2010 | Choi et al. ..................... 327/157 |

OTHER PUBLICATIONS

Jri Lee, "A 75-GHz PLL in 90-nm CMOS Technology," ISSCC Dig. Tech. Papers, pp. 432-433, 613, Feb. 2007.
Kun-Hung Tsai and Shen-luan Liu, "A 43.7mW 96GHz PLL in 65nm CMOS," ISSCC Dig. Tech. Papers, pp. 276-277, Feb. 2009.
Bo-Yu Lin, and Shen-luan Lui, "Analysis and Design of D-Band Injection-Locked Frequency Dividers," IEEE Journal of Solid-State Circuits, vol. 46, No. 6, Jun. 2011.

* cited by examiner

*Primary Examiner* — John Poos
(74) *Attorney, Agent, or Firm* — CKC Partners Co., Ltd.

(57) ABSTRACT

The PLL includes a voltage-controlled oscillator (VCO), a frequency down conversion circuit, a phase-frequency detector (PFD), and an adjusting circuit. The VCO is configured to generate an output clock signal. The frequency down conversion circuit is configured to receive the output clock signal and an auxiliary clock signal, and to mix the output clock signal and the auxiliary clock signal to generate a feedback clock signal. By detecting the strength of the feedback clock signal, it provides an auxiliary signal to adjust the frequency of the output clock signal. The PFD is configured to compare the frequencies and the phases of the feedback clock signal and a reference clock signal to generate an adjusting signal. The adjusting circuit is configured to receive the adjusting signal, and to adjust the frequency of the output clock signal generated by the VCO according to the adjusting signal.

9 Claims, 5 Drawing Sheets

PHASE-LOCKED LOOP

RELATED APPLICATIONS

This application claims priority to Taiwan Application Serial Number 101139487, filed Oct. 25, 2012, which is herein incorporated by reference.

BACKGROUND

1. Field of Invention

The present disclosure relates to an electrical circuit. More particularly, the present invention relates to a phase-locked loop (PLL).

2. Description of Related Art

With advances in technology, high frequency (e.g., in range of THz) circuits have been applied to various field, such as communication, biomedical imaging and spectroscopy for sensing and detection.

Phase-locked loops (PLLs) are common circuits in signal processing systems, for locking a reference clock signal. Generally, the PLL includes a phase-frequency detector (PFD), a voltage-controlled oscillator (VCO), and a feedback circuit for feeding an output clock signal outputted by the VCO to the PFD. In a high frequency signal processing system, due to the frequency of the output clock signal outputted by the VCO is higher than the operating frequencies of the PFD and a traditional frequency divider, a high frequency PLL commonly uses an injection-locked frequency divider (ILFD) as a prescaler, so as to down convert the frequency of the output clock signal outputted by the VCO in the feedback circuit. However, any frequency misalignment between ILFD and VCO may cause improper divider output frequency and PLL fail to lock.

SUMMARY

Therefore, one aspect of the present invention is directed to a phase-locked loop (PLL), in which the PLL uses a mixer to replace the prescaler for dividing the frequency of the output clock signal outputted by the voltage-controlled oscillator (VCO).

In accordance with one embodiment, of the present invention, the PLL include a VCO, a frequency down conversion circuit, a phase-frequency detector (PFD), and an adjusting circuit. The VCO is configured to generate an output clock signal. The frequency down conversion circuit, which is electrically coupled to the VCO, is configured to receive the VCO's output clock signal and an auxiliary clock signal, and to mix the output clock signal and the auxiliary clock signal so as to generate a feedback clock signal. The PFD, which is electrically coupled to the frequency down conversion circuit, is configured to receive the feedback clock signal and a reference clock signal, and to compare the frequencies and the phases of the feedback clock signal and a reference clock signal to generate an adjusting signal. The adjusting circuit is electrically coupled to the PFD and the VCO, and is configured to receive the adjusting signal and to adjust the frequency of the output clock signal generated by the VCO according to the adjusting signal.

In accordance with one embodiment of the present invention, the frequency down conversion circuit includes a mixer. The mixer is configured to mix the output clock signal and the auxiliary clock signal, so as to generate the feedback clock signal.

In accordance with one embodiment of the present invention, the frequency down conversion circuit further includes a post frequency divider. The post frequency divider is electrically coupled to the mixer and the PFD, for dividing the frequency of the feedback clock signal.

In accordance with one embodiment of the present invention, the frequency down conversion circuit further includes a prescaler. The prescaler is electrically coupled to the VCO and the mixer, for dividing the frequency of the output clock signal.

In accordance with one embodiment of the present invention, the frequency of the feedback clock signal is equal to the difference of the frequencies between the output clock signal and the n-th order harmonics of auxiliary clock signal (n can be an arbitrary positive integer number).

In accordance with one embodiment of the present invention, during the initialization of the PLL, the frequency of the output clock signal is preset to be higher than the n-th order harmonic frequency of the auxiliary clock signal.

In accordance with one embodiment of the present invention, the frequency down conversion circuit includes a received signal strength indicator (RSSI) and a controller. The RSSI is configured to detect the strength of the feedback clock signal. The controller is electrically coupled to the RSSI. When the strength of the feedback clock signal is smaller than a predetermined threshold, the controller adjusts the frequency of the output clock signal through the adjusting circuit according to RSSI.

In accordance with one embodiment of the present invention, the adjusting circuit includes a charge pump (CP) and an adjusting capacitor. The CP is electrically coupled to the PFD, and is configured to receive the adjusting signal and generate an adjusting current according to the adjusting signal. The adjusting capacitor is electrically coupled to the CP. The adjusting current is configured to adjust the voltage across the adjusting capacitor. The frequency of the VCO's output clock signal is varied along with the voltage across the adjusting capacitor. When the strength of the feedback clock signal is smaller than the predetermined threshold, the controller disables the CP and replaces the CP to adjust the voltage across the adjusting capacitor according to RSSI, so as to adjust the frequency of the VCO's output clock signal.

In accordance with one embodiment of the present invention, the controller includes a control unit, and a resistor ladder. The control unit is electrically coupled to the RSSI. The resistor ladder is electrically coupled to the adjusting capacitor and the control unit. When the strength of the feedback clock signal is smaller than the predetermined threshold, the control unit disables the CP and controls the resistor ladder to adjust the voltage across the adjusting capacitor.

In accordance with one embodiment of the present invention, the frequency down conversion circuit includes an amplifier. The amplifier is configured to amplify the strength of the feedback clock signal.

In summary, one embodiment of the present disclosure provides a PLL, in which the PLL uses the mixer to replace the traditional prescaler to down convert the frequency. In such a configuration, not only the requirement of the high operating frequency of the frequency divider in the PLL can be achieved, the power consumption of the high frequency divider can be reduced, but the frequency misalignment problem by using the injection-locked frequency divider (ILFD) can also be avoided, such that the PLL can therefore operate steadily. In addition, in one embodiment of the present disclosure, the strength of the feedback clock signal can be detected by the RSSI, and the frequency of the output clock signal can be accordingly adjusted.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
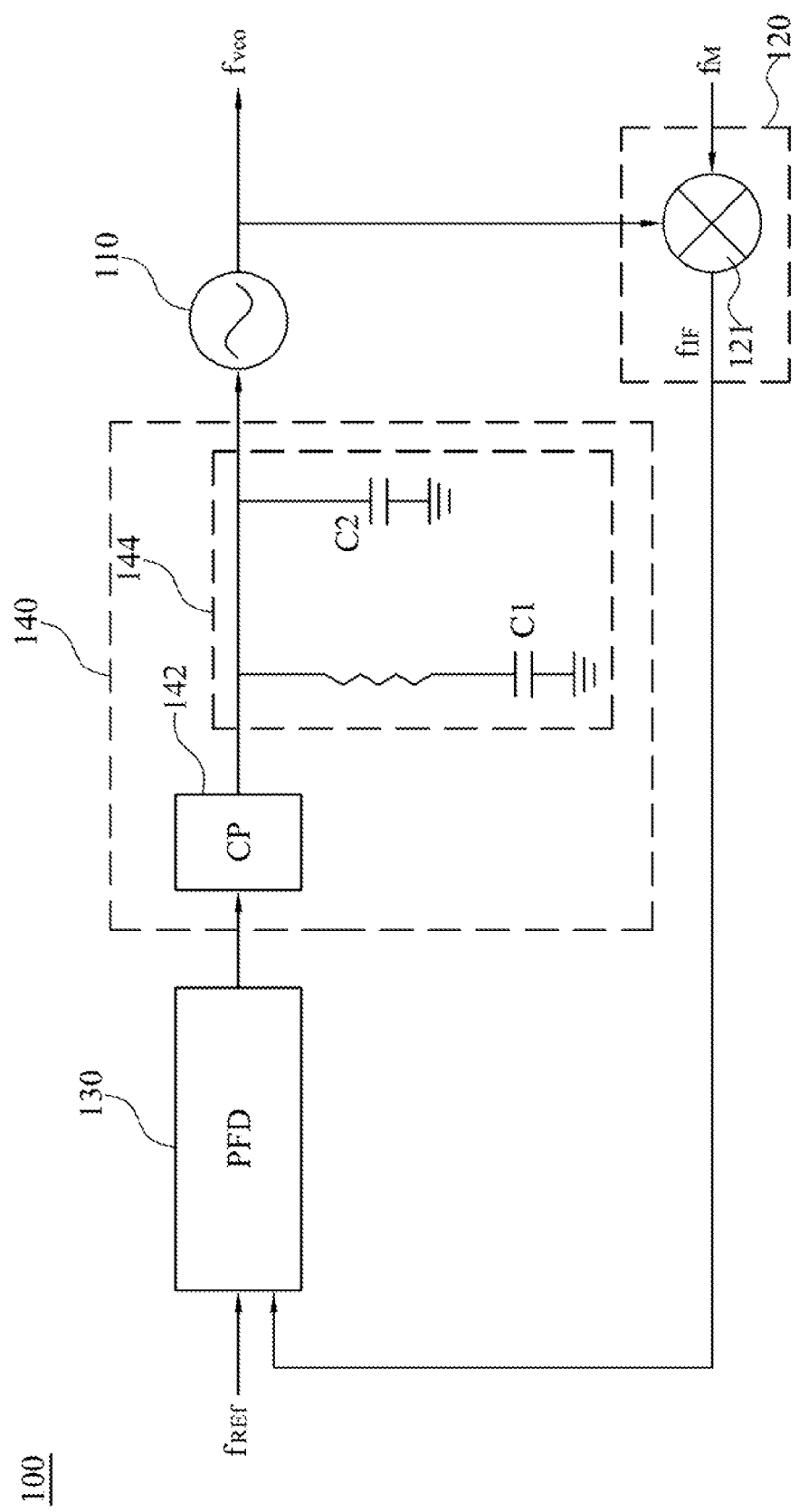
FIG. 1 is a block diagram of a phase-locked loop (PLL) in accordance with one embodiment of the present disclosure.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

FIG. 1 is a block diagram of a phase-locked loop (PLL) in accordance with one embodiment of the present invention. In this embodiment, the PLL 100 can include a voltage-controlled oscillator (VCO) 110, a frequency down conversion circuit 120, a phase-frequency detector (PFD) 130, and an adjusting circuit 140. In structure, the PFD 130 is electrically coupled to the adjusting circuit 140. The adjusting circuit 140 is electrically coupled to the VCO 110. The frequency down conversion circuit 120 is electrically coupled to the output end of the VCO 110 and the input end of the PFD, for serving as a feedback path.

In operation, the VCO 110 can generate an output clock signal $f_{VCO}$. The frequency down conversion circuit 120 can receive the output clock signal $f_{VCO}$ and an auxiliary clock signal $f_M$, and mix the output clock signal $f_{VCO}$ and the auxiliary clock signal $f_M$, so as to generate a feedback clock signal $f_{IF}$. The PFD 130 can receive the feedback clock signal $f_{IF}$ and a reference clock signal $f_{REF}$ and compare the frequencies and the phases of the feedback clock signal $f_{IF}$ and the reference clock signal $f_{REF}$ to generate an adjusting signal. The adjusting circuit 140 can receive the adjusting signal, and adjust the frequency of the output clock signal $f_{VCO}$ generated by the VCO 110 according to the adjusting signal.

In one embodiment, when mixing the output clock signal $f_{VCO}$ and the auxiliary clock signal $f_M$, the frequency down conversion circuit 120 can be a harmonic mixer which selects either the fundamental or harmonic mode output as the feedback clock signal $f_{IF}$ by a filter. That is, the frequency of the feedback clock signal $f_{IF}$ can be the difference of frequencies between the output clock signal $f_{VCO}$ and n-th order harmonics of the auxiliary clock signal $f_M$, in which n is an arbitrary positive integer. For the convenient of description, in the following paragraphs, the fundamental mode output will be selected as an example, and that is, n is equal to 1, and the frequency of the feedback clock signal $f_{IF}$ can be the difference of frequencies between the output clock signal $f_{VCO}$ and the auxiliary clock signal $f_M$. However, it is noted that this invention is not limited to such an example. The PFD 130 compares the phases of the feedback clock signal $f_{IF}$ and the reference clock signal $f_{REF}$, when the phase of the feedback clock signal $f_{IF}$ is leading to the phase of the reference clock signal $f_{REF}$, the PFD 130 reduces the frequency of the output clock signal $f_{VCO}$ generated by the VCO 110 by the adjusting circuit 140. On the other hand, when the phase of the feedback clock signal $f_{IF}$ is lagging to the phase of the reference clock signal $f_{REF}$, the PFD 130 increases the frequency of the output clock signal $f_{VCO}$ generated by the VCO 110 by the adjusting circuit 140. In such a manner, when the output clock signal $f_{VCO}$ is locked, the feedback clock signal $f_{IF}$ is equal to the reference clock signal $f_{REF}$, and the output clock signal $f_{VCO}$ is equal to the sum of frequencies of the reference clock signal $f_{REF}$ and the auxiliary clock signal $f_M$. Accordingly, the frequency of the output clock signal $f_{VCO}$ can be adjusted by changing the frequency of the auxiliary clock signal $f_M$. For example, when the frequency of the auxiliary clock signal $f_M$ is M times of the frequency of the reference clock signal $f_{REF}$, the frequency of the output clock signal $f_{VCO}$ would be M+1 times of the frequency of the reference clock signal $f_{REF}$. It achieves frequency down conversion without ILFD frequency divider to save power and avoid potential frequency misalignment issues.

In one embodiment of the present disclosure, the frequency down conversion circuit 120 includes a mixer 121. The mixer 121 can include a band pass filter (not shown). When the frequency down conversion circuit 120 receives the output clock signal $f_{VCO}$ and the auxiliary clock signal $f_M$, the mixer 121 can down convert the frequency of the output clock signal $f_{VCO}$ and generate the feedback clock signal $f_{IF}$. The band pass filter can be used to select the feedback clock signal $f_{IF}$, in which the frequency of the feedback clock signal $f_{IF}$ is the difference of frequencies between the output clock signal $f_{VCO}$ and the n-th order harmonics of the auxiliary clock signal $f_M$, wherein n for example is equal to 1. The mixer 121 can be operated in a high speed, and thus using the mixer 121 to mix signals and process down conversion can increase the operating speed of the PLL 100.

In addition, for proper operation, the frequency of the output clock signal $f_{VCO}$ can be preset to be higher than the frequency of the auxiliary clock signal $f_M$ during the initialization of the PLL 100.

In one embodiment of the present disclosure, the adjusting circuit 140 can include a charge pump (CP) 142 and a loop filter 144. The CP 142 is electrically coupled to the PFD 130, for receiving the adjusting signal generated by the PFD 130 and generating an adjusting current according to the adjusting signal. The loop filter 144 is electrically coupled to the CP 142 and the VCO 110, and is used to adjust a voltage provided to the VCO 110 according to the adjusting current. More particularly, the loop filter 144 can include an adjusting capacitor C1. The CP 142 can charge or discharge the adjusting capacitor C1 by generating the adjusting current corresponding to the adjusting signal. For example, when the adjusting signal is configured to raise the voltage across the adjusting capacitor C1, the CP 142 can charge the adjusting capacitor C1 by the adjusting current, and when the adjusting signal is configured to pull down the voltage across the adjusting capacitor C1, the CP 142 can discharge the adjusting capacitor C1 by the adjusting current. In addition, the loop filter 144 can further include another capacitor C2, for filtering out the noise.

Figure 2:
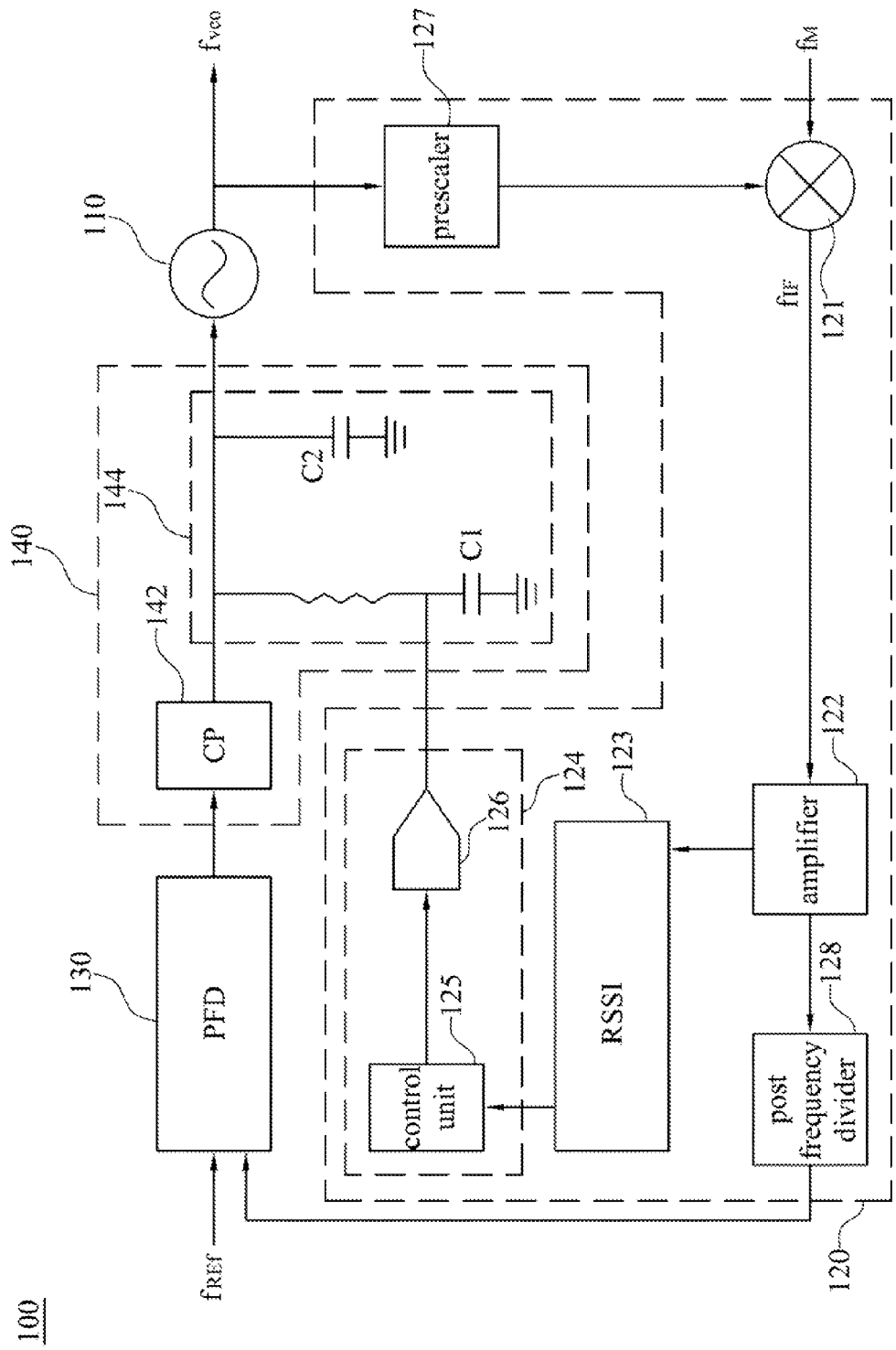
FIG. 2 is a block diagram of the PLL in accordance with another embodiment of the present disclosure.

FIG. 2 is a block diagram of the PLL 100 in accordance with another embodiment of the present disclosure. This embodiment is similar to the embodiment in FIG. 1, and the repeated description thereof will be omitted.

In this embodiment, the frequency down conversion circuit 120 can further includes an amplifier 122, a received signal strength indicator (RSSI) 123 and a controller 124. The amplifier 122 is electrically coupled to the mixer 121, for amplifying the strength of the feedback clock signal $f_{IF}$. The RSSI 123 is electrically coupled to the amplifier 122, for detecting the strength of the amplified feedback clock signal $f_{IF}$. The controller 124 is electrically coupled to the RSSI 123, for selectively reducing the frequency of the output clock signal $f_{VCO}$ according to the strength of the amplified feedback clock signal $f_{IF}$.

Figure 3:
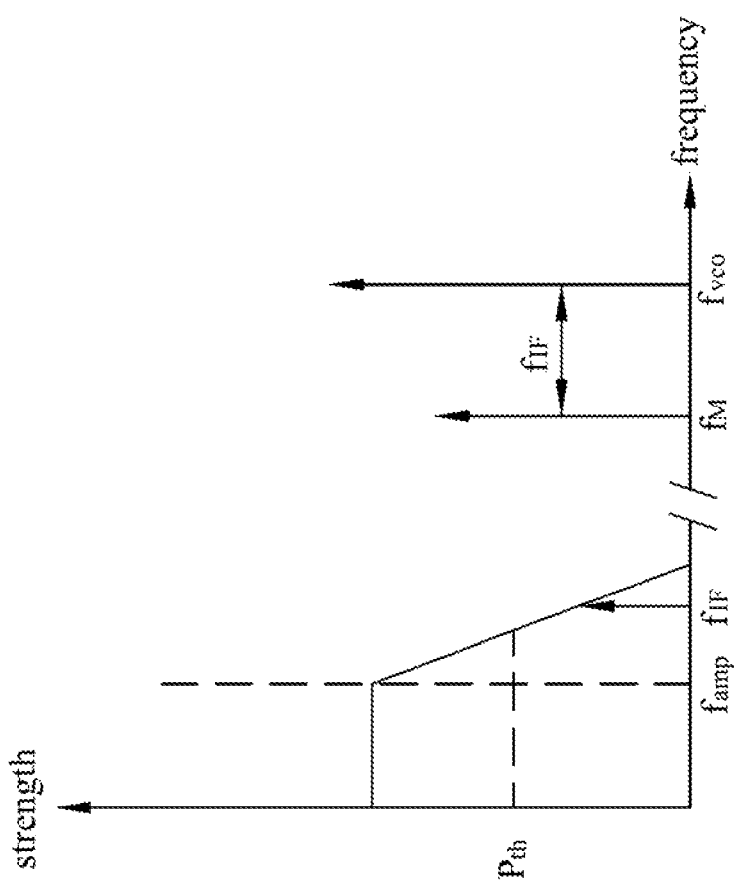
FIG. 3, 4 is a diagram illustrating the relationship between the strength of the feedback clock signal and the frequency of the output clock signal in accordance with one embodiment of the present disclosure.

FIG. 3, 4 is a diagram illustrating the relationship between the strength of the feedback clock signal $f_{IF}$ and the frequency of the output clock signal $f_{VCO}$ in accordance with one embodiment of the present disclosure.

Figure 4:
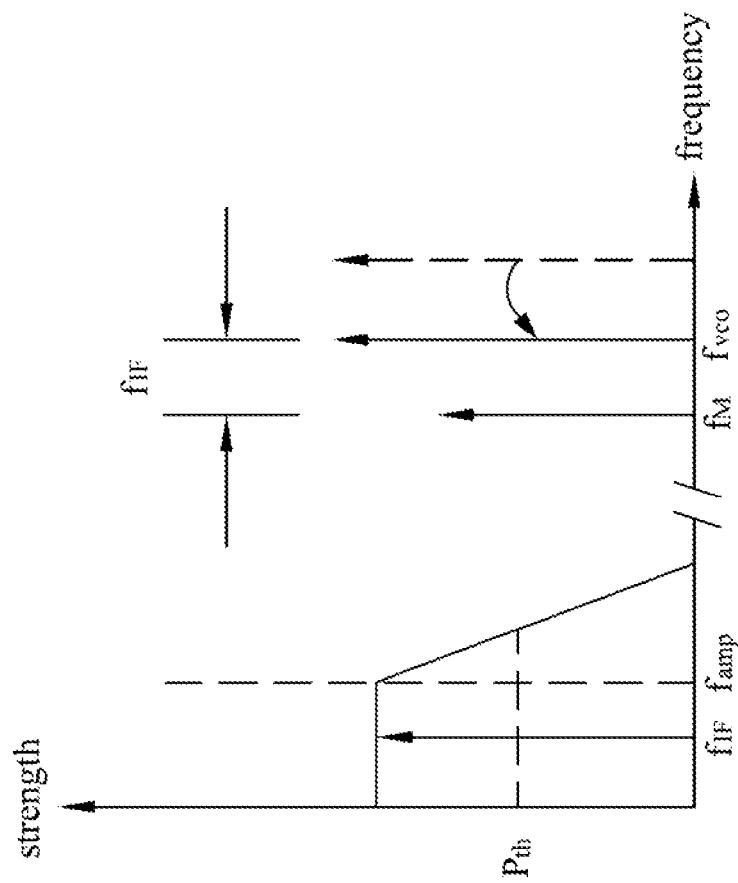

As mentioned before, the frequency of the feedback clock signal $f_{IF}$ can be the difference of the frequencies between the output clock signal $f_{VCO}$ and the auxiliary clock signal $f_M$. Therefore, the larger the difference of the frequencies between the output clock signal $f_{VCO}$ and the auxiliary clock signal $f_M$ is, the greater the frequency of the feedback clock signal $f_{IF}$ is. Referring to FIG. 3, when the difference of the frequencies between the output clock signal $f_{VCO}$ and the auxiliary clock signal $f_M$ is too large, such that the frequency of the feedback clock signal $f_{IF}$ exceeds the bandwidth $f_{amp}$ of the amplifier 122, the strength of the feedback clock signal $f_{IF}$ can not be effectively amplified by the amplifier 122. When the strength of the amplified feedback clock signal $f_{IF}$ is smaller than a predetermined threshold $P_{th}$, the controller 124 can reduce the frequency of the output clock signal $f_{VCO}$ by the adjusting circuit 140. In one embodiment, the controller 124 can disable the CP 142 of the adjusting circuit 140 and adjust the voltage across the adjusting capacitor C1 according to the RSSI 123, so as to adjust the frequency of the output clock signal $f_{VCO}$. Referring to FIG. 4, when the frequency of the output clock signal $f_{VCO}$ is pulled-in by said operating, the difference of the frequencies between the output clock signal $f_{VCO}$ and the auxiliary clock signal $f_M$ is reduced, and the frequency of the feedback clock signal $f_{IF}$ is also reduced. When the frequency of the feedback clock signal $f_{IF}$ is reduced, the feedback clock signal $f_{IF}$ can be effectively amplified by the amplifier 122. When the strength of the amplified feedback clock signal $f_{IF}$ is larger than the predetermined threshold $P_{th}$, the controller 124 stop adjusting the frequency of the output clock signal $f_{VCO}$ according to the RSSI 123. For example, the controller 124 can stop adjusting the voltage across the adjusting capacitor C1, and re-enable the CP 142.

By utilizing said RSSI 123 and controller 124, the PLL 100 can pull-in the output clock signal $f_{VCO}$ in a short time when the difference of the frequencies between the output clock signal $f_{VCO}$ and the auxiliary clock signal $f_M$ is large, and correct the output clock signal $f_{VCO}$ by the PFD 130 when the frequencies of the output clock signal $f_{VCO}$ and the auxiliary clock signal $f_M$ are approaching. In such a manner, the lock time of the PLL 100 can be reduced.

It is noted that, said amplifier 122 can be replaced by other components with passband frequencies (that is, the strength of the output signal of such a component would decay due to the fact that the frequency of the input signal of the component is beyond the passband frequencies), such as a buffer or a filter. In addition, said controller 124 can be realized by a logic circuit, an analog circuit, or a circuit composed with digital and analog circuits.

In one embodiment of the present disclosure, for implementing the function of said controller 124, the controller 124 can include a control unit 125 and a resistor ladder 126. The control unit 125 is electrically coupled to the RSSI 123 and the resistor ladder 126. The resistor ladder 126 is electrically coupled to the adjusting capacitor C1 of the adjusting circuit 140. The control unit 125 can receive the strength of the feedback clock signal $f_{IF}$ detected by the RSSI 123, and determine if the strength is smaller than the predetermined threshold $P_{th}$. When the strength of the feedback clock signal $f_{IF}$ is smaller than the predetermined threshold $P_{th}$, the control unit 125 can disable the CP 142 and control the resistor ladder 126 for frequency sweeping, so as to adjust the voltage across the adjusting capacitor C1. For example, the control unit 125 can disable CP 142 with a disable signal, and make the resistor ladder 126 to decrease the VCO 110 output frequency $f_{VCO}$ gradually by reducing the voltage across the adjusting capacitor C1. When the strength of the feedback clock signal $f_{IF}$ is larger than the predetermined threshold $P_{th}$, the control unit 125 stops controlling the resistor ladder 126 and re-enables the CP 142. It is noted that, the control unit 125 and the resistor ladder 126 aforementioned are just an example for implementing the controller 124, and the controller 124 can be implemented by another way in another embodiment. For example, the controller 124 may store a look up table, and when the strength of the feedback clock signal $f_{IF}$ is smaller than the predetermined threshold $P_{th}$, the controller 124 can search a corresponding output voltage in the look up table according to the strength of the feedback clock signal $f_{IF}$, so as to adjust the voltage across the capacitor C1 and the frequency of the output clock signal $f_{VCO}$. In addition, one skilled in the art can understand that the control unit 125 can be realized by a logic circuit, an analog circuit, or a circuit composed with digital and analog circuits.

In one embodiment of the present disclosure, the frequency down conversion circuit 120 can include a prescaler 127 and/or a post frequency divider 128. The prescaler 127 can be electrically coupled between the VCO 110 and the mixer 121, for dividing the frequency of the output clock signal $f_{VCO}$ and providing the divided output clock signal $f_{VCO}$ to the mixer 121. The post frequency divider 128 can be electrically coupled between the amplifier 122 and the PFD 130, for dividing the amplified feedback clock signal $f_{IF}$ and providing the divided feedback clock signal $f_{IF}$ to the PFD 130, such that the divided feedback clock signal $f_{IF}$ can be compared with the reference clock signal $f_{REF}$. For example, if the frequency divider ratio of the prescaler 127 is K, and the frequency divider ratio of the post frequency divider 128 is N, then the frequency of the output clock signal $f_{VCO}$ can be described as K×(the frequency of the auxiliary clock signal $f_M$+N×the frequency of the reference clock signal $f_{REF}$) when the output clock signal $f_{VCO}$ is locked.

It is noted that, in the aforementioned embodiment, both of the prescaler 127 and/or the post frequency divider 128 can be removed based on the requirement. This invention is not limited by the aforementioned embodiment.

Figure 5:
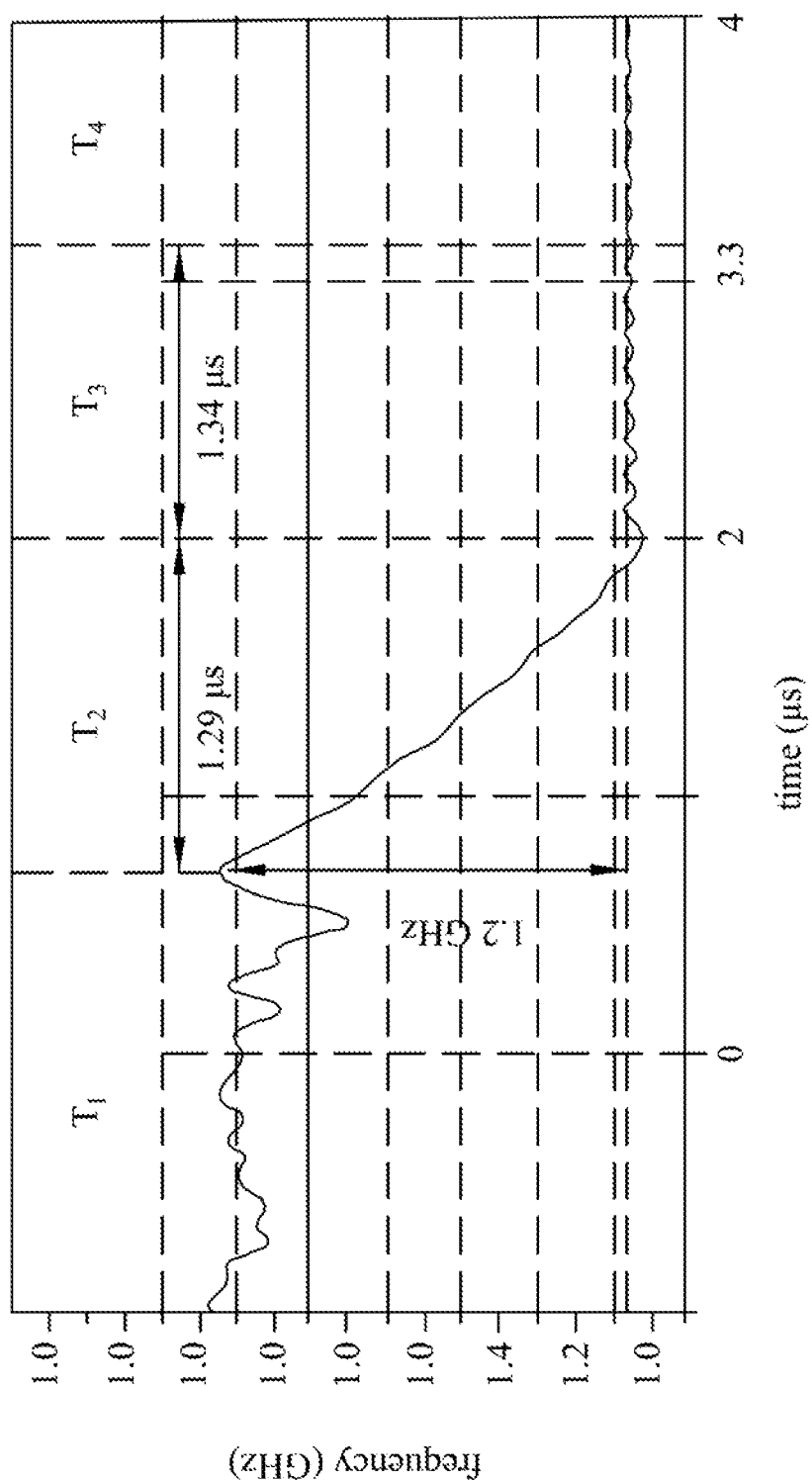
FIG. 5 is a diagram illustrating the dynamic response behavior of the PLL in accordance with one embodiment of the present disclosure.

FIG. 5 is a diagram illustrating the dynamic response behavior of the PLL 100 in one embodiment of the present disclosure. The PLL 100 can be reset during a period T1, and its output frequency $f_{VCO}$ can be pulled-in in a short time by the RSSI 123 and the controller 124 during a period T2. In a period T3, the PLL 100 can adjust the output clock signal $f_{VCO}$ according to the PFD 130 output, and achieve phase and frequency locked in a period T4. As shown in FIG. 5, with a frequency hopping range of 1.2 GHz, the locking time is only 2.63 µs.

It will be apparent to those skilled in the art that various modifications and variations can be made to the structure of the present invention without departing from the scope or spirit of the invention, view of the foregoing, it is intended that the present invention cover modifications and variations of this invention provided they fall within the scope of the following claims.

What is claimed is:

1. A phase-locked loop (PLL), comprising:
   a voltage-controlled oscillator (VCO), configured to generate an output clock signal;
   a frequency down conversion circuit, electrically coupled to the VCO, configured to receive the output clock signal and an auxiliary clock signal, and to mix the output clock signal and the auxiliary clock signal so as to generate a feedback clock signal, wherein the frequency down conversion circuit comprises:
      a received signal strength indicator (RSSI), configured to detect the strength of the feedback clock signal; and
      a controller, electrically coupled to the RSSI, wherein, when the strength of the feedback clock signal is smaller than a predetermined threshold, the controller adjust the frequency of the output clock signal according to RSSI;
   a phase-frequency detector (PFD), electrically coupled to the frequency down conversion circuit, configured to receive the feedback clock signal and a reference clock signal, and to compare the frequencies and the phases of the feedback clock signal and a reference clock signal to generate an adjusting signal; and
   an adjusting circuit, electrically coupled to the PFD and the VCO, configured to receive the adjusting signal, and to adjust the frequency of the output clock signal generated by the VCO according to the adjusting signal.

2. The PLL as claimed in claim 1, wherein the frequency down conversion circuit comprises a mixer, and the mixer is configured to mix the output clock signal and the auxiliary clock signal, so as to generate the feedback clock signal.

3. The PLL as claimed in claim 2, wherein the frequency down conversion circuit further comprises a post frequency divider, and the post frequency divider is electrically coupled to the mixer and the PFD and is configured to divide the frequency of the feedback clock signal.

4. The PLL as claimed in claim 2, wherein the frequency down conversion circuit further comprises a prescaler, and the prescaler is electrically coupled to the VCO and the mixer and is configured to divide the frequency of the output clock signal.

5. The PLL as claimed in claim 1, wherein the frequency of the feedback clock signal is equal to the difference of the frequencies between the output clock signal and the n-th order harmonics of the auxiliary clock signal, and wherein n is a positive integer number.

6. The PLL as claimed in claim 1, wherein during the initialization of the PLL, the frequency of the output clock signal is preset to be higher than the n-th order harmonic frequency of the auxiliary clock signal.

7. The PLL as claimed in claim 1, wherein the adjusting circuit comprises:
   a charge pump (CP), electrically coupled to the PFD, configured to receive the adjusting signal and generate an adjusting current according to the adjusting signal; and
   an adjusting capacitor, electrically coupled to the CP;
   wherein the adjusting current is configured to adjust a voltage across the adjusting capacitor, the frequency of the output clock signal is varied along with the voltage across the adjusting capacitor,
   and wherein, when the strength of the feedback clock signal is smaller than the predetermined threshold, the controller disables the CP and adjusts the voltage across the adjusting capacitor according to the RSSI, so as to adjust the frequency of the output clock signal.

8. The PLL as claimed in claim 7, wherein the controller comprises:
   a control unit, electrically coupled to the RSSI; and
   a resistor ladder, electrically coupled to the adjusting capacitor and the control unit;
   wherein, when the strength of the feedback clock signal is smaller than the predetermined threshold the control unit disables the CP and controls the resistor ladder to adjust the voltage across the adjusting capacitor according to RSSI.

9. The PLL as claimed in claim 1, wherein the frequency down conversion circuit comprises an amplifier, and the amplifier is configured to amplify the strength of the feedback clock signal.

* * * * *